(12) United States Patent
Martin et al.

(10) Patent No.: US 11,005,492 B2
(45) Date of Patent: May 11, 2021

(54) DUAL OUTPUT SIGNAL PATHS FOR SIGNAL SOURCE CHANNELS TO OPTIMIZE FOR BANDWIDTH AND AMPLITUDE RANGE

(71) Applicant: Tektronix, Inc., Beaverton, OR (US)

(72) Inventors: Gregory A. Martin, Lake Oswego, OR (US); Pirooz Hojabri, San Jose, CA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/588,613

(22) Filed: Sep. 30, 2019

(65) Prior Publication Data

US 2020/0212926 A1 Jul. 2, 2020

Related U.S. Application Data

(60) Provisional application No. 62/787,217, filed on Dec. 31, 2018.

(51) Int. Cl.
*H03M 1/66* (2006.01)
(52) U.S. Cl.
CPC .................... *H03M 1/66* (2013.01)
(58) Field of Classification Search
CPC ...................................... H03M 1/66
USPC .................................. 341/130–165
See application file for complete search history.

(56) References Cited

U.S. PATENT DOCUMENTS

| 6,344,814 | B1* | 2/2002 | Lin | G09G 3/3685 |
| | | | | 341/144 |
| 7,589,983 | B1* | 9/2009 | Lin | H02M 3/33515 |
| | | | | 323/367 |
| 8,680,894 | B1* | 3/2014 | Inbar | G09G 3/346 |
| | | | | 327/108 |
| 8,779,958 | B1* | 7/2014 | Maurino | H03M 3/35 |
| | | | | 341/144 |
| 9,407,278 | B1* | 8/2016 | Dempsey | H03M 1/661 |
| 9,614,541 | B2* | 4/2017 | Chakrabarti | H03M 1/78 |

(Continued)

OTHER PUBLICATIONS

Texas Instruments, Inc., Multi-Channel Analog Output Module with Multiplexed Single-Channel DAC for PLCs Reference Design, TIDUBL9A, available at http://www.ti.com/lit/ug/tidubl9a/tidubl9a.pdf?ts=1591730024358, Apr. 18, 2016, last accessed Jun. 9, 2020, Texas Instruments, Incorporated.

(Continued)

*Primary Examiner* — Lam T Mai
(74) *Attorney, Agent, or Firm* — Miller Nash Graham & Dunn; Andrew J. Harrington

(57) ABSTRACT

A signal source device includes at least one digital-to-analog converter, at least one connector, a first output path from the at least one digital-to-analog converter to the at least one connector, and a second output path from the at least one digital-to-analog converter to the at least one connector. A method of generating a analog signal includes generating at least one analog signal from at least one digital-to-analog converter, transmitting a first analog signal of the at least one analog signal along a first output path from the at least one digital-to-analog converter to at least one connector, and transmitting a second analog signal of the at least one analog signal along a second output path from the at least one digital-to-analog converter to the at least one connector.

18 Claims, 4 Drawing Sheets

(56) References Cited

U.S. PATENT DOCUMENTS

| | | | |
|---|---|---|---|
| 2003/0043925 A1* | 3/2003 | Stopler | H04L 25/067 375/254 |
| 2006/0230423 A1* | 10/2006 | Burgett | H04N 21/418 725/107 |
| 2006/0285702 A1 | 12/2006 | Felder | |
| 2008/0100605 A1* | 5/2008 | Shirai | G09G 3/3688 345/206 |
| 2010/0109734 A1* | 5/2010 | Rylov | H03H 11/20 327/256 |
| 2013/0190909 A1* | 7/2013 | Sunaga | H04S 3/008 700/94 |
| 2016/0285419 A1* | 9/2016 | Milkov | H04N 5/3745 |
| 2019/0109738 A1* | 4/2019 | Kudo | H04L 25/08 |

OTHER PUBLICATIONS

European Patent Office, Extended European Search Report and Written Opinion for European Application No. 19220194.5, dated Jun. 4, 2020, 8 pages, Munich, Germany.

* cited by examiner

DUAL OUTPUT SIGNAL PATHS FOR SIGNAL SOURCE CHANNELS TO OPTIMIZE FOR BANDWIDTH AND AMPLITUDE RANGE

CROSS-REFERENCE TO RELATED APPLICATIONS

This application claims the benefit of U.S. Provisional Pat. App. No. 62/787,217, filed Dec. 31, 2018, the disclosure of which is hereby incorporated by reference.

TECHNICAL FIELD

This disclosure relates to optimization of high-speed outputs that have high bandwidth and high output amplitude range.

BACKGROUND

Optimization of a single high speed output for both high bandwidth and high output amplitude range presents several problems for designs implemented in advanced CMOS IC process nodes. However, some signals have extremely high bandwidth requirements but do not require high amplitude range. In other cases, some signals have lower bandwidth requirements but require high amplitude range point to point in the voltage waveform.

Embodiments of the disclosed apparatus and methods address shortcomings in the prior art.

DETAILED DESCRIPTION

As described here, embodiments provide separate output signal paths from at least one digital-to-analog converter. This allows optimization of one output signal path for high-speed and high-bandwidth, and optimization of the other output for high-speed and high output amplitude range. Trying to optimize a single signal path for both characteristics simultaneously can result in compromised system performance compared to having independent signal paths.

Separate signal paths supports lower data rate waveform generation at high amplitudes, while also supporting generation of higher data rate waveforms that do not require as high of an amplitude range to be used. These signal sources can cover a wide variety of applications.

Figure 1:
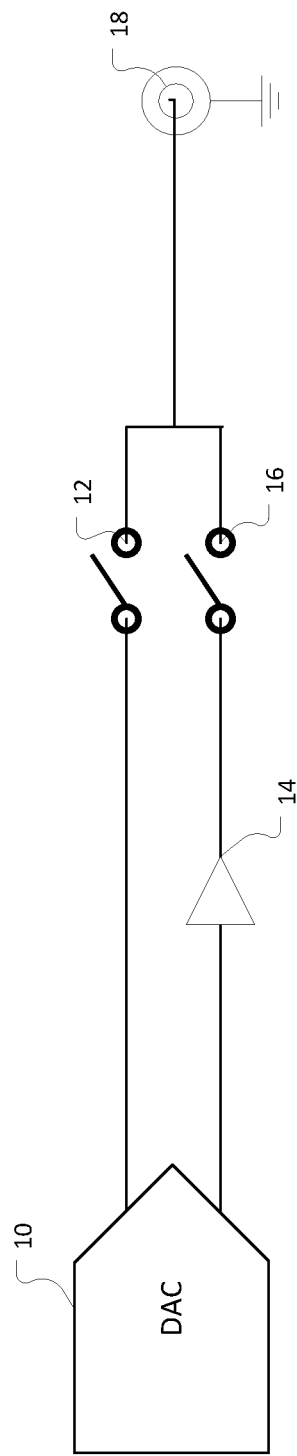
FIG. 1 shows an embodiment of a dual output signal path having one connector and one digital-to-analog converter.

The embodiments here include at least one digital-to-analog converter and at least one output connector. FIG. 1 shows an embodiment in which there is a single digital-to-analog converter 10 and one output connector 18. The output connector 18 provides a single common output connector for both signal paths. When the high-bandwidth path is desired, the switch 12 connects the digital-to-analog converter 10 to the output connector 18. When the extended amplitude range path is desired, the switch 16 connects the digital-to-analog converter 10 to the output connector 18. This path may include an amplifier stage 14 to extend the amplitude range of this signal path.

Figure 2:
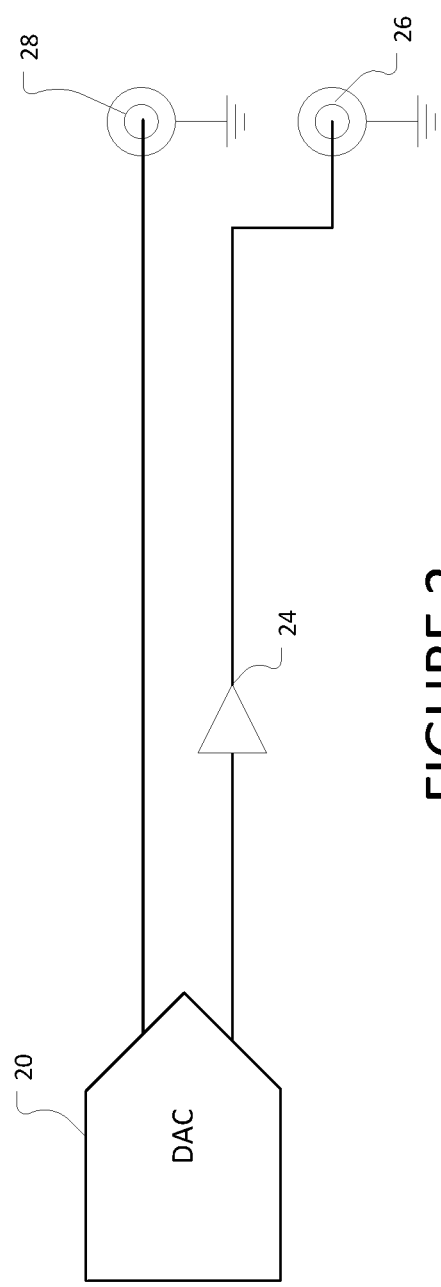
FIG. 2 shows an embodiment of a dual output signal path having two connectors and one digital-to-analog converter.

FIG. 2 shows an embodiment in which there is a single digital-to-analog converter 20 and two output connectors 28 and 26. Each output connector connects to one of the signal paths. When the user wants the high-bandwidth output, the user can connect to the output connector 28. When the user wants the extended amplitude range signal, the user can connect to the output connector 26. This path may include an amplifier 24 to extend the amplitude range of this signal path.

In the embodiments of FIGS. 1 and 2, the signal paths and output connectors could be single-ended, as shown, or differential signaling. The digital-to-analog converters in FIGS. 1 and 2 drive two outputs to drive both signal paths, regardless of the signaling used. Having the digital-to-analog converter drive both signal paths avoids the loss of passively splitting a single digital-to-analog converter output into two signal paths. In addition, a passive splitter would further degrade the bandwidth and other performance characteristics, which is especially undesirable for a high-bandwidth signal path.

Figure 3:
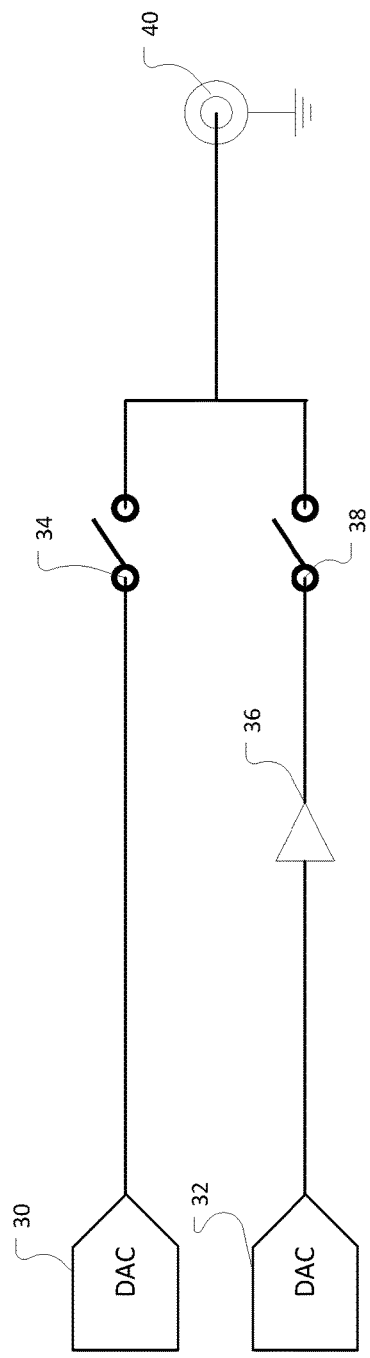
FIG. 3 shows an embodiment of a dual output signal path having one connector and two digital-to-analog converters.
Figure 4:
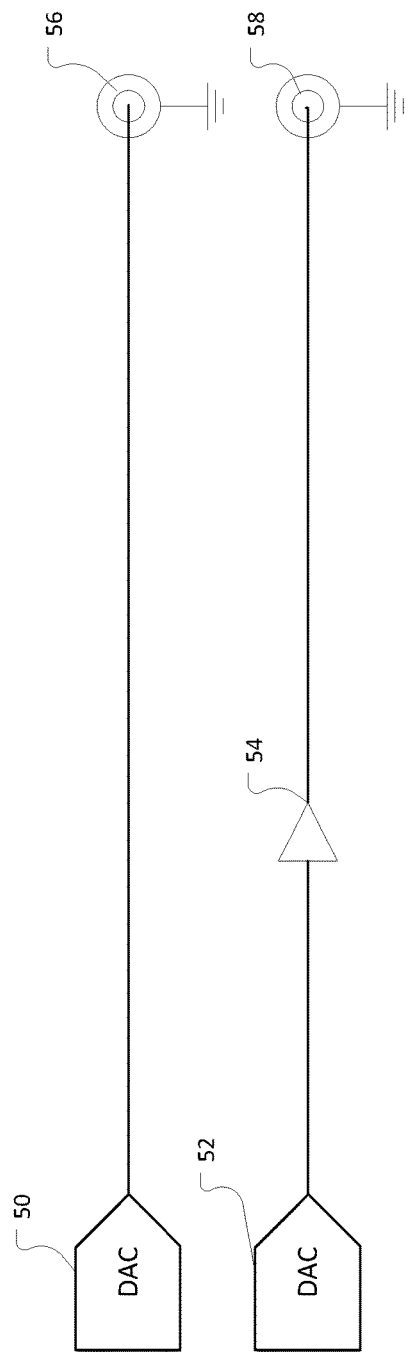
FIG. 4 shows an embodiment of a dual output signal path having two connectors and two digital-to-analog converters.

In FIGS. 3 and 4, the at least one digital-to-analog converter comprises two digital-to-analog converters, one for each path. In FIG. 3, the embodiment has two digital-to-analog converters 30, 32 and one output connector 40. When the high-bandwidth path is desired, the switch 34 connects the digital-to-analog converter 30 to the output connector 40. When the extended amplitude range path is desired, the switch 38 connects the digital-to-analog converter 32 to the output connector 40. This path may include an amplifier stage 36 to extend the amplitude range of this signal path.

In FIG. 4, the at least one digital-to-analog converter comprises two digital-to-analog converters 50, 52, and the at least one output connector comprises two output connectors 56, 58. When the user wants the high-bandwidth output signal, the user can connect to the connector 56 connected to the digital-to-analog converter 50. When the user wants the extended amplitude range signal path, the user can connect to the connector 58 connected to the digital-to-analog converter 52. The extended amplitude range path between the digital-to-analog converter 52 and the connector 58 may include the amplifier stage 54.

Considerations in selecting between a single digital-to-analog converter and having two digital-to-analog converters include cost and power efficiencies. Using a single digital-to-analog converter to drive two output paths may be more cost and power efficient over using two digital-to-analog converters, because the two-output digital-to-analog converter can share most of the circuitry and split the signal further downstream in the signal path. The location of the split in the digital-to-analog circuitry can be optimized to minimize the impact to the output bandwidth as well as optimize other system performance aspects.

In the embodiments, one signal path is optimized for high bandwidth and has a minimal number of components, because adding components to the signal path can degrade bandwidth. The other signal path is optimized for extended amplitude range. This may involve the addition of amplifiers mentioned above. This may extend the supported output amplitude range, but may result in a degradation of bandwidth.

The selection of having one output connector versus two output connectors (for single-end signaling—additional connectors could be used for differential signaling) also has some considerations. Having common output connector(s) for the two signal paths, whether single or differential signaling, may have advantages for applications that dynamically switch between (1) lower data rate/higher amplitude range waveforms and (2) high data rate/lower amplitude range waveforms. This would not require the user to switch between output connectors. The switches, however, may have some impact on the bandwidth in the signal paths.

Having two connectors for the two signal paths may have benefits for applications where the same instrument is shared for different uses, including lower data rate and higher amplitude range waveforms versus high data rate waveforms with lower amplitude range. The lower data rate/bandwidth signal path can use an output connector that is more cost effective in terms of external cabling requirements to connect to the instrument relative to the high data rate signal path.

Figure 5:
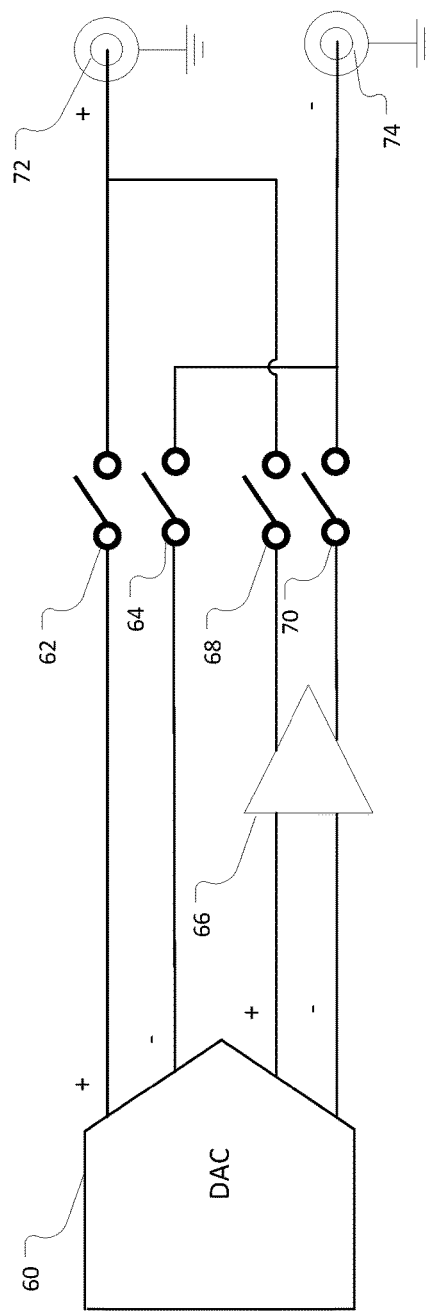
FIG. 5 shows an embodiment of a dual output signal path having two connectors and one digital-to-analog converter.
Figure 6:
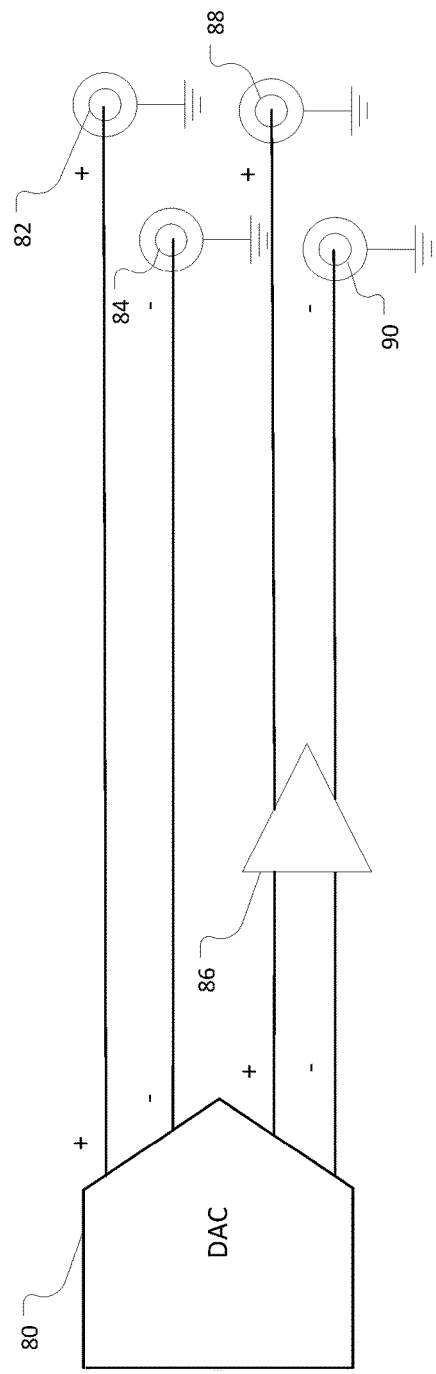
FIG. 6 shows an embodiment of a dual output signal path having two connectors with differential signaling.

As mentioned above, the digital-to-analog converters can have single or differential signaling. FIGS. 5 and 6 show embodiments of a signal source having one differential digital-to-analog converter and either two connectors or four connectors. In FIG. 5, for example, a single differential analog-to-digital converter 60 generates two analog signals, each with a positive and a negative component for differential signaling. The first positive analog signal is connected to switch 62 and the first negative analog signal is connected to switch 64. The second positive analog signal is connected to the amplifier 66 and then to switch 68. The second negative analog signal is connected to the amplifier 66 and then to switch 70. The respective positive analog signals are connected by their switches 62 and 68 to the first connector 72, and the respective negative analog signals are connected by their switches 64 and 70 to the second connector 74.

In FIG. 6, there are four connectors, one for each polarity of each signal produced by the differential digital-to-analog converter 80. The first positive analog signal connects to connector 82, and the first negative output signal connects to connector 84. Similarly, the second positive analog signal connects to connector 88 through amplifier 86, and the second negative analog signal connects to connector 90 through amplifier 86.

Figure 7:
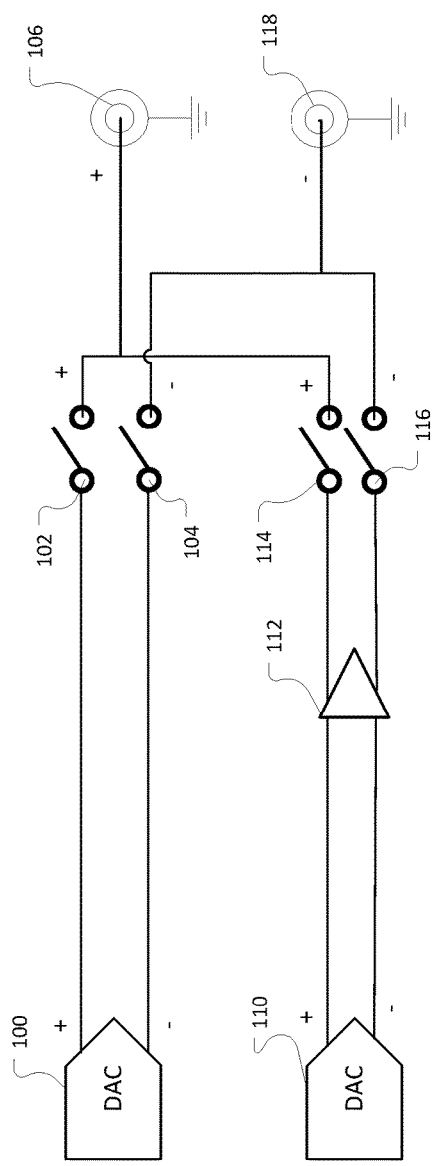
FIG. 7 shows an embodiment of a dual output signal path having two connectors and two differential digital-to-analog converters.
Figure 8:
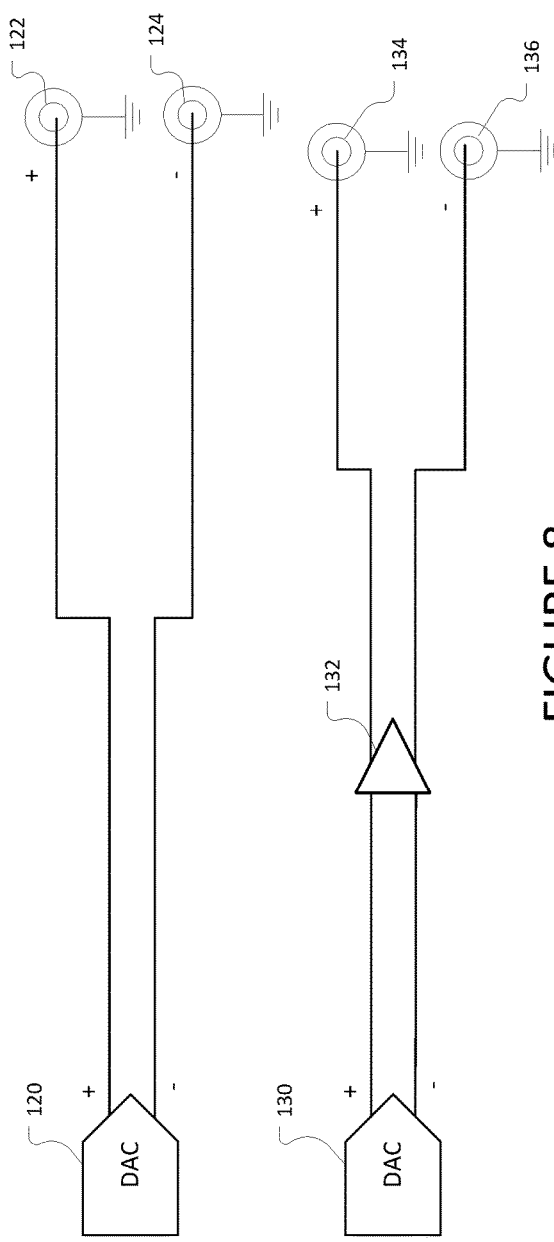
FIG. 8 shows an embodiment of a dual output signal path having four connectors and two differential digital-to-analog converters.

FIGS. 7 and 8 show embodiments of a signal source device having two digital-to-analog converters that produce differential outputs, referred to here as differential digital-to-analog converters. Depending upon the embodiment, the device may have two or four connectors.

In FIG. 7, for example, the digital-to-analog converter 100 transmits a first positive analog signal to switch 102 and a first negative analog signal to switch 104. The first output path comprises a first positive output path and a first negative output path. Similarly, the digital-to-analog converter 110 transmits a second positive analog signal to switch 114 and a second negative analog signal to switch 116. The second output path comprises a second positive output path and a second negative output path. The second positive analog signal and the second negative analog signal may be amplified by differential amplifier 112. The positive analog signals are connected by their respective switches to connector 106, and the negative analog signals are connected by their respective switches to connector 118.

In FIG. 8, each output of each differential digital-to-analog converter is connected to a separate connector. Differential digital-to-analog converter 120 transmits a first positive analog signal to connector 122, and a first negative analog signal to a connector 124. Similarly, the differential digital-to-analog converter 130 transmits a second positive analog signal to connector 134 and a second negative analog signal to connector 136. These signals may be amplified by the amplifier 132. These examples provide embodiments of differential signaling and are not intended to be limited to any particular implementation.

In this manner, two different outputs can be provided from the digital-to-analog converter or converters, each optimized for either high bandwidth or extended range amplitude range.

EXAMPLES

Illustrative examples of the disclosed technologies are provided below. An embodiment of the technologies may include one or more, and any combination of, the examples described below.

Example 1 is a signal source device, comprising at least one digital-to-analog converter; at least one connector; a first output path from the at least one digital-to-analog converter to the at least one connector; and a second output path from the at least one digital-to-analog converter to the at least one connector.

Example 2 is the signal source device of claim 1, further comprising an amplifier in the second output path.

Example 3 is the signal source device of either of examples 1 and 2, wherein the at least one digital-to-analog converter comprises a single digital-to-analog converter and wherein the at least one connector comprises a single connector, the device further comprising a first switch in the first output path and a second switch in the second output path, the first switch and the second switch connected to the single connector.

Example 4 is the signal source device of any one of examples 1-3, wherein the at least one digital-to-analog converter comprises a single digital-to-analog converter and wherein the at least one connector comprises two connectors, a first connector connected to the first output path, and a second connector connected to the second output path.

Example 5 is the signal source device of any one of examples 1-4, wherein the at least one digital-to-analog converter comprises a single differential digital-to-analog converter and wherein the at least one connector comprises two connectors, the device further comprising a first switch in a first positive output path, a second switch in a first negative output path, a third switch in a second positive output path, and a fourth switch in a second negative output path, the first switch and the third switch being connected to a first connector, and the second switch and the fourth switch being connected to a second connector.

Example 6 is the signal source device of any one of examples 1-5, wherein the at least one digital-to-analog converter comprises a single differential digital-to-analog converter and wherein the at least one connector comprises four connectors, a first positive output path connected to a first connector, a first negative output path connected to a second connector, a second positive output path connected to a third connector, and a second negative output path connected to a fourth connector.

Example 7 is the signal source device of any one of examples 1-6, wherein the at least one digital-to-analog converter comprises two digital-to-analog converters, a first digital-to-analog converter connected to the first output path, and a second digital-to-analog converter connected to the second output path, and wherein the at least one connector comprises a single connector, the device further comprising a first switch in the first output path and a second switch in a second output path, the first switch and the second switch connected to the single connector.

Example 8 is the signal source device of any one of examples 1-7, wherein the at least one digital-to-analog converter comprises two digital-to-analog converters, a first digital-to-analog converter connected to the first output path, and a second digital-to-analog converter connected to the second output path, and wherein the at least one connector comprises two connectors, a first connector connected to the first output path, and a second connector connected to the second output path.

Example 9 is the signal source device of any one of examples 1-8, wherein the at least one digital-to-analog converter comprises two differential digital-to-analog converters, a first differential digital-to-analog converter connected to the first output path, and a second differential digital-to-analog converter connected to the second output path, the first output path comprises a first positive output path having a first switch, and a first negative output path having a second switch, and the second output path comprises a second positive output path having a third switch, and a second negative output path having a fourth switch, and the at least one connector comprises two connectors, a first connector connected to the first and third switches, and a second connector connected to the second and fourth switches.

Example 10 is the signal source device in any one of examples 1-9, wherein the at least one digital-to-analog converter comprises two differential digital-to-analog converters, a first differential digital-to-analog converter connected to the first output path, and a second differential digital-to-analog converter connected to the second output path, and the first output path comprises a first positive output path and a first negative output path, and the second output path comprises a second positive output path and a second negative output paths, and the at least one connector comprises four connectors, a first connector connected to the first positive output path, a second connector connected to the first negative output path, a third connector connected to the second positive output path, and a fourth connector connected to the second negative output path.

Example 11 is a method of generating an analog signal, comprising generating at least one analog signal from at least one digital-to-analog converter; transmitting a first analog signal of the at least one analog signal along a first output path from the at least one digital-to-analog converter to at least one connector; and transmitting a second analog signal of the at least one analog signal along a second output path from the at least one digital-to-analog converter to the at least one connector.

Example 12 is the method of example 11, further comprising amplifying the second signal before the second signal reaches the at least one connector.

Example 13 is the method of either of examples 11 and 12, wherein transmitting the first analog signal to at least one connector and transmitting the second analog signal to at least one connector comprises transmitting the first analog signal from a first digital-to-analog converter to a first switch connected to a single connector and transmitting the second analog signal from the first digital-to-analog converter to a second switch connected to the single connector.

Example 14 is the method in any one of examples 11-13, wherein transmitting the first analog signal to at least one connector and transmitting the second analog signal to at least one connector comprises transmitting the first analog signal to a first connector from a first digital-to-analog converter and transmitting the second analog signal to a second connector from the first digital-to-analog converter.

Example 15 is the method in any one of examples 11-14, wherein transmitting the first analog signal to at least one connector comprises transmitting, from a first differential digital-to-analog converter, a first positive analog signal to a first switch and a first negative analog signal to a second switch, and transmitting the second analog signal to at least one connector comprises transmitting, from the first differential digital-to-analog converter, a second positive analog signal to a third switch, and a second negative analog signal to a fourth switch, a first connector connected to the first and third switches and a second connector connected to the second and fourth switches.

Example 16 is the method in any one of examples 11-15, wherein transmitting the first analog signal to at least one connector comprises transmitting, from a first differential digital-to-analog converter, a first positive analog signal to a first connector and a first negative analog signal to a second connector, and transmitting the second analog signal to at least one connector comprises transmitting, from the first differential digital-to-analog converter, a second positive analog signal to a third connector and a second negative analog signal to a fourth connector.

Example 17 is the method in any one of examples 11-16, wherein transmitting the first analog signal to at least one connector comprises transmitting the first analog signal from a first digital-to-analog converter to a first switch connected to a single connector, and transmitting the second analog signal from a second digital-to-analog converter to a second switch connected to the single connector.

Example 18 is the method in any one of examples 11-17, wherein transmitting the first analog signal to at least one connector comprises transmitting the first analog signal from a first digital-to-analog converter to a first connector, and transmitting the second analog signal comprises transmitting the second analog signal from a second digital-to-analog converter to a second connector.

Example 19 is the method in any one of examples 11-18, wherein transmitting the first analog signal to at least one connector comprises transmitting, from a first differential digital-to-analog converter, a first positive analog signal to a first switch connected to a first connector, and transmitting a first negative analog signal to a second switch connected to a second connector, and transmitting the second analog signal to at least one connector comprises transmitting, from a second differential digital-to-analog converter, a second positive analog signal to a third switch connected to the first connector, and a second negative analog signal to a fourth switch connected to the second connector.

Example 20 is the method in any one of examples 11-19, wherein transmitting the first analog signal to at least one connector comprises transmitting, from a first differential digital-to-analog converter, a first positive analog signal to a first connector, and transmitting a first negative analog signal to a second connector, and transmitting the second analog signal to at least one connector comprises transmitting, from a second differential digital-to-analog converter, a second positive analog signal to a third connector, and a second negative analog signal to a fourth connector.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A signal source device, comprising:
   a digital-to-analog converter;
   at least one output connector;
   a first output path from the digital-to-analog converter to the at least one output connector; and
   a second output path from the digital-to-analog converter to the at least one output connector;
   wherein the digital-to-analog converter drives a first output to the first output path and drives a second output to the second output path.

2. The signal source device as claimed in claim 1, further comprising an amplifier in the second output path.

3. The signal source device as claimed in claim 1, wherein the at least one output connector comprises a single output connector, the device further comprising a first switch in the first output path and a second switch in the second output path, the first switch and the second switch connected to the single output connector.

4. The signal source device as claimed in claim 1, wherein the at least one output connector comprises two output connectors, a first output connector connected to the first output path, and a second output connector connected to the second output path.

5. The signal source device as claimed in claim 1, wherein the digital-to-analog converter comprises a differential digital-to-analog converter and wherein the at least one output connector comprises two output connectors, the device further comprising a first switch in a first positive output path, a second switch in a first negative output path, a third switch in a second positive output path, and a fourth switch in a second negative output path, the first switch and the third switch being connected to a first output connector, and the second switch and the fourth switch being connected to a second output connector.

6. The signal source device as claimed in claim 1, wherein the digital-to-analog converter comprises a differential digital-to-analog converter and wherein the at least one output connector comprises four output connectors, a first positive output path connected to a first output connector, a first negative output path connected to a second output connector, a second positive output path connected to a third output connector, and a second negative output path connected to a fourth output connector.

7. The signal source device as claimed in claim 1, wherein:
   the first digital-to-analog converter comprises a first differential digital-to-analog converter, and the second digital-to-analog converter comprises a second differential digital-to-analog converter,
   the first output path comprises a first positive output path having a first switch, and a first negative output path having a second switch, and the second output path comprises a second positive output path having a third switch, and a second negative output path having a fourth switch, and
   the at least one output connector comprises two connectors, a first output connector connected to the first and third switches, and a second output connector connected to the second and fourth switches.

8. The signal source device as claimed in claim 1, wherein:
   the first digital-to-analog converter comprises a first differential digital-to-analog converter, and the second digital-to-analog converter comprises a second differential digital-to-analog converter, and
   the first output path comprises a first positive output path and a first negative output path, and the second output path comprises a second positive output path and a second negative output paths, and
   the at least one output connector comprises four output connectors, a first output connector connected to the first positive output path, a second output connector connected to the first negative output path, a third output connector connected to the second positive output path, and a fourth output connector connected to the second negative output path.

9. A signal source device, comprising,
   a first digital-to-analog converter;
   a second digital-to-analog converter;
   at least one output connector;
   a first output path from the first digital-to-analog converter to the at least one output connector; and
   a second output path from the second digital-to-analog converter to the at least one output connector;
   wherein one of the first and second output paths includes and amplifier and the other of the first and second output paths does not include an amplifier.

10. The signal source device as claimed in claim 9, wherein the at least one output connector comprises two output connectors, a first output connector connected to the first output path, and a second output connector connected to the second output path.

11. A method of generating an analog signal, comprising:
   generating an analog signal from a digital-to-analog converter;
   transmitting the analog signal along a first output path from the digital-to-analog converter to at least one output connector; and
   transmitting the analog signal along a second output path from the digital-to-analog converter to the at least one output connector;

wherein the digital-to-analog converter drives a first output to the first output path and drives a second output to the second output path.

12. The method as claimed in claim 11, further comprising amplifying the signal in the second signal path before the signal reaches the at least one output connector.

13. The method as claimed in claim 11, wherein transmitting the analog signal along the first output path and transmitting the analog signal along the second output path comprises transmitting the analog signal from the digital-to-analog converter to a first switch connected to a single output connector and transmitting the analog signal from the digital-to-analog converter to a second switch connected to the single output connector.

14. The method as claimed in claim 11, wherein transmitting the analog signal along the first output path to at least one output connector and transmitting the analog signal along the second output path to at least one output connector comprises transmitting the analog signal to a first output connector from the digital-to-analog converter and transmitting the analog signal to a second output connector from the digital-to-analog converter.

15. The method as claimed in claim 11, wherein transmitting the analog signal along the first output path to at least one output connector comprises transmitting, from a differential digital-to-analog converter, a first positive analog signal to a first switch and a first negative analog signal to a second switch, and transmitting the analog signal along the second output path to at least one output connector comprises transmitting, from the differential digital-to-analog converter, a second positive analog signal to a third switch, and a second negative analog signal to a fourth switch, a first output connector connected to the first and third switches and a second output connector connected to the second and fourth switches.

16. The method as claimed in claim 11, wherein transmitting the analog signal along the first output path to at least one output connector comprises transmitting, from a differential digital-to-analog converter, a first positive analog signal to a first output connector and a first negative analog signal to a second output connector, and transmitting the analog signal along the second output path to at least one output connector comprises transmitting, from the differential digital-to-analog converter, a second positive analog signal to a third output connector and a second negative analog signal to a fourth output connector.

17. The method as claimed in claim 11, wherein:
transmitting the analog signal along the first output path to at least one output connector comprises transmitting, from a first differential digital-to-analog converter, a first positive analog signal to a first switch connected to a first output connector, and transmitting a first negative analog signal to a second switch connected to a second output connector, and
transmitting the analog signal along the second output path to at least one output connector comprises transmitting, from a second differential digital-to-analog converter, a second positive analog signal to a third switch connected to the first output connector, and a second negative analog signal to a fourth switch connected to the second output connector.

18. The method as claimed in claim 11, wherein:
transmitting the analog signal along the first output path to at least one output connector comprises transmitting, from a first differential digital-to-analog converter, a first positive analog signal to a first output connector, and transmitting a first negative analog signal to a second output connector, and
transmitting the analog signal along the first output path to at least one output connector comprises transmitting, from a second differential digital-to-analog converter, a second positive analog signal to a third output connector, and a second negative analog signal to a fourth output connector.

* * * * *